(12) United States Patent
Sun et al.

(10) Patent No.: US 12,548,705 B2
(45) Date of Patent: Feb. 10, 2026

(54) INTEGRATED VOLTAGE REGULATOR

(71) Applicant: Navitas Semiconductor Limited, Dublin (IE)

(72) Inventors: Hao Sun, Shanghai (CN); Zhen Zhou, Shanghai (CN)

(73) Assignee: Navitas Semiconductor Limited, Dublin (IE)

( * ) Notice: Subject to any disclaimer, the term of this patent is extended or adjusted under 35 U.S.C. 154(b) by 356 days.

(21) Appl. No.: 18/057,682

(22) Filed: Nov. 21, 2022

(65) Prior Publication Data

US 2023/0093166 A1    Mar. 23, 2023

(51) Int. Cl.

| | |
|---|---|
| H01F 27/26 | (2006.01) |
| B60L 53/22 | (2019.01) |
| H01F 27/22 | (2006.01) |
| H01F 27/30 | (2006.01) |
| H02M 1/42 | (2007.01) |
| H02M 1/44 | (2007.01) |
| H02M 3/22 | (2006.01) |
| H02M 7/00 | (2006.01) |
| H02M 7/66 | (2006.01) |
| H05K 1/02 | (2006.01) |
| H05K 1/11 | (2006.01) |
| H05K 1/181 | (2026.01) |

(52) U.S. Cl.
CPC ............ *H01F 27/263* (2013.01); *B60L 53/22* (2019.02); *H01F 27/22* (2013.01); *H01F 27/306* (2013.01); *H02M 1/4208* (2013.01); *H02M 1/44* (2013.01); *H02M 3/22* (2013.01); *H02M 7/003* (2013.01); *H02M 7/66* (2013.01); *H05K 1/0204* (2013.01); *H05K 1/0207* (2013.01); *H05K 1/119* (2013.01); *H05K 1/181* (2013.01); *B60L 2210/30* (2013.01); *B60L 2210/40* (2013.01)

(58) Field of Classification Search
CPC ...... H01F 27/263; H01F 27/306; H01F 27/22; B60L 53/22; H02M 1/4208; H02M 1/44
USPC .......................................... 361/760
See application file for complete search history.

(56) References Cited

U.S. PATENT DOCUMENTS

| | | | |
|---|---|---|---|
| 6,424,544 | B1 | 7/2002 | Svardsjo |
| 7,236,041 | B2 | 6/2007 | Kim |
| 7,764,521 | B2 | 7/2010 | Lin |
| 7,791,910 | B2 | 9/2010 | Pwu |
| 9,748,854 | B2 | 8/2017 | Li |
| 10,056,844 | B2 | 8/2018 | Quaglino |
| 10,554,140 | B1 | 2/2020 | Khamesra |
| 10,651,746 | B2 | 5/2020 | Song |
| 11,626,808 | B1 | 4/2023 | Vinciarelli |
| 11,641,165 | B2 | 5/2023 | Zhang |

(Continued)

OTHER PUBLICATIONS

Office Action (Final Rejection) dated Jul. 21, 2025 for U.S. Appl. No. 18/590,850 (pp. 1-13).

(Continued)

*Primary Examiner* — Andargie M Aychillhum
(74) *Attorney, Agent, or Firm* — FisherBroyles, LLP

(57) ABSTRACT

An integrated voltage regulator comprises a plurality of semiconductor devices and a circuit board including a plurality of thermally conductive inlays. At least one of the plurality of electronic devices is thermally coupled to at least one of the plurality of thermally conductive inlays. A substrate is thermally coupled to the circuit board and to the plurality of thermally conductive inlays.

18 Claims, 3 Drawing Sheets

(56) References Cited

U.S. PATENT DOCUMENTS

| | | |
|---|---|---|
| 11,935,681 B2 | 3/2024 | Sun |
| 2002/0140403 A1 | 10/2002 | Reddy |
| 2003/0193820 A1 | 10/2003 | Nakayama |
| 2003/0222503 A1 | 12/2003 | Lam |
| 2006/0018133 A1 | 1/2006 | Hua |
| 2010/0102327 A1* | 4/2010 | Standing ............... H01L 25/072 257/213 |
| 2018/0287482 A1 | 10/2018 | Schult |
| 2018/0374802 A1* | 12/2018 | Zheng .................... H05K 1/165 |
| 2019/0386546 A1* | 12/2019 | Iwagami .................. H02K 5/04 |
| 2020/0156476 A1 | 5/2020 | Suzuki |
| 2020/0247218 A1 | 8/2020 | Zheng |
| 2021/0045574 A1* | 2/2021 | Eno ......................... A47J 33/00 |
| 2022/0020678 A1* | 1/2022 | Matsubara ........ H01L 23/49811 |
| 2022/0103003 A1 | 3/2022 | Sahoo |
| 2022/0159839 A1* | 5/2022 | Cho .................... H05K 3/4602 |
| 2022/0271683 A1 | 8/2022 | Houda |
| 2022/0396167 A1 | 12/2022 | Sharifipour |
| 2023/0070930 A1 | 3/2023 | Gu |
| 2023/0092009 A1 | 3/2023 | Sun |
| 2023/0208320 A1 | 6/2023 | Sun |
| 2024/0195312 A1 | 6/2024 | Huang |
| 2024/0195313 A1 | 6/2024 | Huang |
| 2024/0203635 A1 | 6/2024 | Sun |

OTHER PUBLICATIONS

Office Action (Non-Final Rejection) dated Feb. 13, 2025 for U.S. Appl. No. 18/590,850 (pp. 1-12).

Office Action (Non-Final Rejection) dated Aug. 27, 2025 for U.S. Appl. No. 18/531,617 (pp. 1-12).

Office Action (Non-Final Rejection) dated Aug. 27, 2025 for U.S. Appl. No. 18/531,619 (pp. 1-14).

* cited by examiner

INTEGRATED VOLTAGE REGULATOR

CROSS-REFERENCES TO OTHER APPLICATIONS

This application claims priority to the following commonly-assigned Chinese provisional patent applications: Ser. No. 20/221,0777120.7, filed on Jul. 1, 2022, Ser. No. 20/221,0995777.0, filed on Aug. 18, 2022, and Ser. No. 20/221,0993190.6, filed on Aug. 18, 2022, which are each hereby incorporated by reference in their entirety for all purposes. This application is also related to the following concurrently-filed and commonly-assigned U.S. patent applications: Ser. No. 18/057,692, entitled "BI-DIRECTIONAL POWER CONVERTER MODULE," filed Nov. 21, 2022, and Ser. No. 18/057,697, entitled "INTEGRATED TRANSFORMER," filed Nov. 21, 2022, which are also hereby incorporated by reference in their entirety for all purposes.

FIELD

The described embodiments relate generally to power electronics and integrated voltage regulation. More specifically, the described embodiments relate to voltage regulators that efficiently conduct thermal energy from the semiconductor components.

BACKGROUND

Voltage regulators are used in myriad electrical systems including automotive systems. As performance demands are increased on automotive systems the voltage regulators are required to handle increasing amounts of power and operate under higher temperatures.

SUMMARY

In some embodiments an integrated voltage regulator is presented. The voltage regulator comprises a plurality of electronic devices. Included is a circuit with a plurality of thermally conductive inlays, wherein at least one of the plurality of electronic devices is thermally coupled to at least one of the plurality of thermally conductive inlays. A substrate is thermally coupled to the circuit board and to the plurality of thermally conductive inlays. In some embodiments at least one of the pluralities of thermally conductive inlays comprise copper and extends through a thickness of the circuit board. At least one of the plurality of electronics is soldered to a respective one of the plurality of thermally conductive inlays. In some embodiments a thermal interface material is positioned between the circuit board and the substrate and a spring-loaded clip is configured to hold the thermal interface material under compression. In some embodiments an insulative cover positioned between the spring-loaded clip and the plurality of electronic components is included. The plurality of electronics devices includes one or more gallium nitride-based devices as well as the substrate being a direct-bond copper laminate.

In some embodiments an electronic assembly is disclosed comprising a circuit board including a thermally conductive inlay that extends through a thickness of the circuit board, a semiconductor device positioned within an electronic package that is attached to a top surface of the circuit board and thermally coupled to the thermally conductive inlay. A thermal interface material is positioned across at least a portion of a bottom surface of the circuit board and a substrate is thermally coupled to the circuit board via the thermal interface material. In some embodiments the conductive inlay comprise copper and are press fit within the circuit board. The electronic package is soldered to the thermally conductive inlay and a spring-loaded clamp is configured to hold the thermal interface material under compression. In some embodiments an insulative cover is positioned between the spring-loaded clips and the electronic package, the semiconductor device is a gallium nitride-based device, and the substrate is a direct-bonded copper laminate.

In some embodiments a method of forming an electronics assembly is presented. The method is comprised of forming a circuit board with an aperture formed in the board. The method further includes positioning an inlay within the aperture, securing it within the aperture, attaching an electronic package on to a top surface of the circuit board and thermally coupling the electronic package to the thermal inlay. In some embodiments attaching a thermal interface material to a bottom surface of the circuit board and attaching a substrate to the thermal interface material is disclosed. In some embodiments the inlay extends through a thickness of the circuit board. The electronic package includes a gallium nitride-based device.

DETAILED DESCRIPTION

Several illustrative embodiments will now be described with respect to the accompanying drawings, which form a part hereof. The ensuing description provides embodiment(s) only and is not intended to limit the scope, applicability, or configuration of the disclosure. Rather, the ensuing description of the embodiment(s) will provide those skilled in the art with an enabling description for implementing one or more embodiments. It is understood that various changes may be made in the function and arrangement of elements without departing from the spirit and scope of this disclosure. In the following description, for the purposes of explanation, specific details are set forth in order to provide a thorough understanding of certain inventive embodiments. However, it will be apparent that various embodiments may be practiced without these specific details. The figures and description are not intended to be restrictive. The word "example" or "exemplary" is used herein to mean "serving as an example, instance, or illustration." Any embodiment or design described herein as "exemplary" or "example" is not necessarily to be construed as preferred or advantageous over other embodiments or designs.

Some embodiments of the disclosure relate to an integrated voltage regulator that may be particularly useful for electric vehicles. More specifically, techniques disclosed herein relate to voltage regulators that are compact and efficiently couple thermal energy to a heatsink to provide improved performance.

For example, in some embodiments an integrated voltage regulator includes a plurality of power semiconductor devices attached to a circuit board. Thermal inlays are positioned within the circuit board to efficiency couple heat out of the semiconductor devices to a substrate. The substrate may be metal and/or ceramic and configured to efficiently couple thermal energy to a cold plate. Thermal interface materials may be used at any of the interfaces.

In order to better appreciate the features and aspects of integrated voltage regulators according to the present disclosure, further context for the disclosure is provided in the following section by discussing one particular implementation of an integrated voltage regulator having four semiconductor devices. These embodiments are for example only and other embodiments can have any suitable number of semiconductor device including three or more, four or more, five or more, etc.

Figure 1:
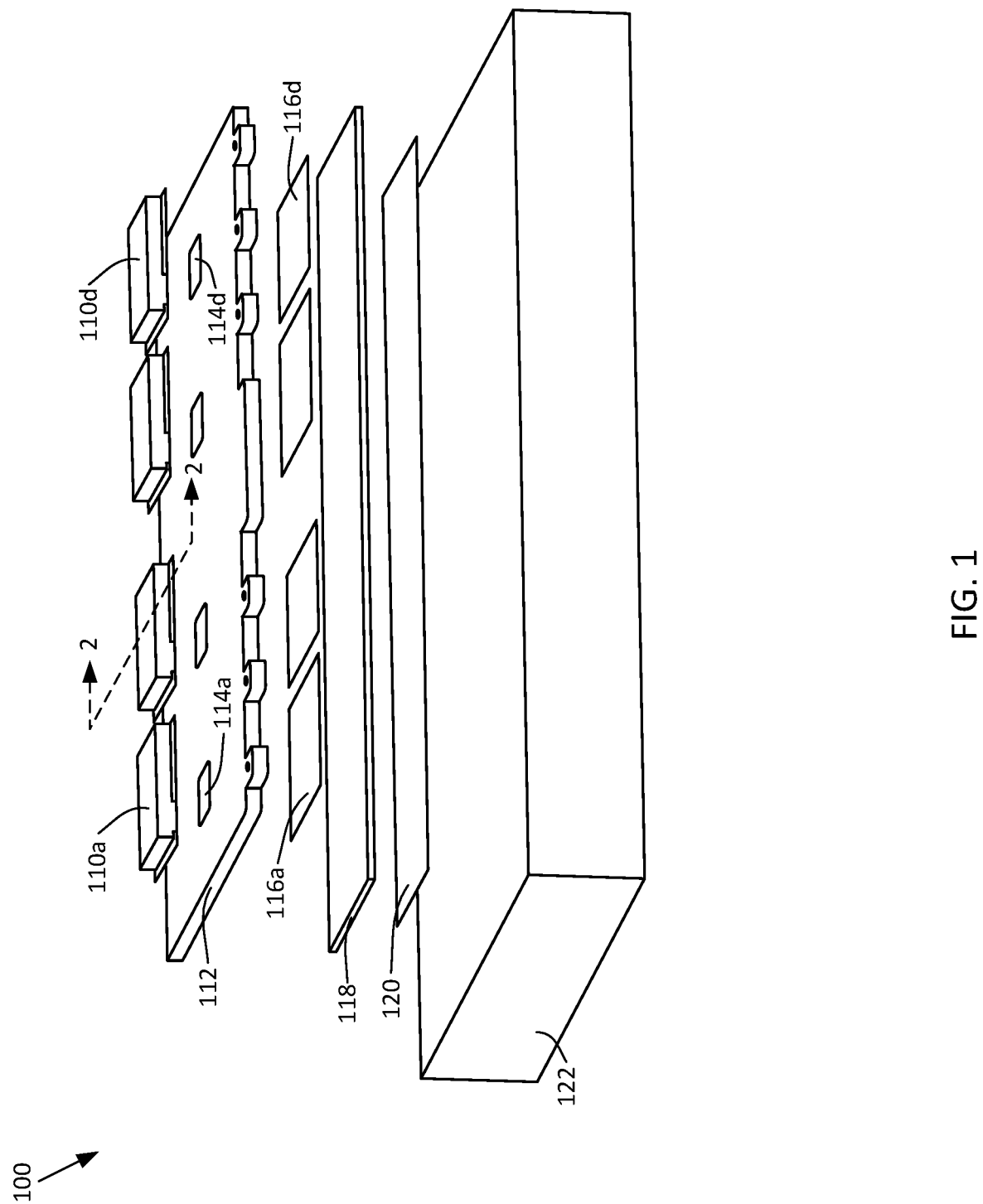
FIG. 1 shows a simplified exploded view of an integrated voltage regulator, according to embodiments of the disclosure.

FIG. 1 shows a simplified exploded view of an integrated voltage regulator 100, according to embodiments of the disclosure. As shown in FIG. 1, four electronic devices 110a-110d are attached to a circuit board 112. In some embodiments electronic devices 110a-110d are GaN power HEMTs, however in other embodiments they can be silicon, silicon-carbide or other suitable devices. Electronic devices 110a-110d may include any suitable type of electronic package including a TO leadless (e.g., TOLL), quad-flat no lead or other electronic package, especially one configured to conduct thermal energy to a base portion. Circuit board 112 can be any suitable type of single or multilayer electrical routing structure including organic or ceramic based insulative layers.

Circuit board 112 includes thermal inlays 114a-114d positioned under each respective electronic device 110a-110d. In some embodiments thermal inlays 114a-114d extend through an entire thickness of circuit board 112 and efficiently conduct thermal energy out of each respective electronic device 110a-110d. For example, in some embodiments thermal inlays 114a-114d are made from copper, brass, aluminum, aluminum-nitride or other suitable high-thermal conductivity material and are press-fit, soldered, brazed or swaged into the circuit board 112 to hold them in place within the circuit board. More specifically, in some embodiments one or more apertures are formed through a thickness of circuit board 112 and thermal inlays 114a-114d are positioned within the apertures and secured in place.

In some embodiments each electronic device 110a-110d is soldered to the respective thermal inlay 114a-114d with a suitable solder alloy (e.g., lead-free tin/silver/copper alloy, sintered silver, etc.), however in other embodiments a thermal interface material may be used. As further shown in FIG. 1 circuit board 112 may be thermally coupled to a substrate 118 with a thermal interface material 116a-116d, which in some cases may be solder. When thermal interface material 116a-116d is a solder, it may have a different geometry than shown and in some embodiments may be approximately the same length and width as thermal inlays 114a-114d. In various embodiments, thermal interface material 116a-116d may have varied geometries where one or more have a different length and/or width and in one embodiment all four may be combined into a monolithic layer. In some embodiments substrate 118 can be a multi-layer thermally conductive routing structure such as direct bonded copper (DBC) or other suitable structure such as, but not limited to an insulated metal substrate (IMS). In further embodiments instead of substrate 118 being a monolithic structure as shown in FIG. 1, the substrate may be two, three, four or more separate substrates. In one example, substrate 118 is four separate substrates, each aligned with a respective electronic device 110a-110d and each having a separate respective thermal interface material 116a-116d thermally coupling it to cold plate 122.

Substrate 118 is thermally coupled to a cold plate 122 with a thermal interface material 120, which in some embodiments may be a solder. Cold plate 122 can be a heat sink that transfers thermal energy to air, liquid or other suitable medium. Thus, integrated voltage regulator 100 can be compact and may efficiently transfer thermal energy out of electronic devices 110a-110d to cold plate 122.

In some embodiments electronic devices 110a-110d may be electrically configured to operate as a full-bridge inverter circuit, while in other embodiments they may operate as an AC to DC converter, a DC to DC converter or and AC to AC converter.

In some embodiments the thermal interface materials described herein can be thermally conductive glues, waxes, phase-change materials, metal-containing material, ceramic-containing material, solder material or other suitable thermally conductive material. In various embodiments portions of circuit board 112 can be removed forming apertures and substrate 118 can have one or more extending portions that extend through the apertures and attach directly to electronic device 110 for improved heat transfer and the removal of a thermal interface material. In yet further embodiments, cold plate 122 may include one or more extending portions that extend through substrate 118 and through circuit board 112 to be directly attached to electronic device 110 for further improving the efficiency of heat transfer.

Figure 2:
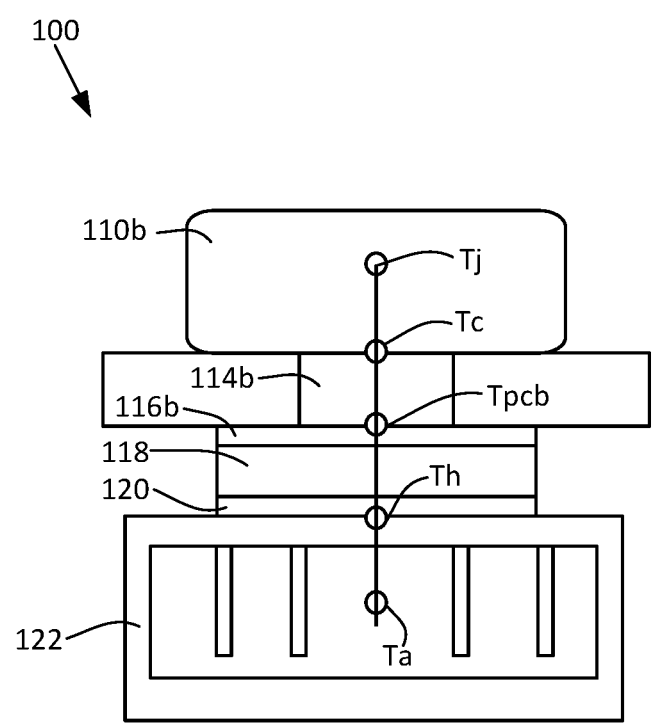
FIG. 2 illustrates a simplified cross-section of the integrated voltage regulator in the region of an electronic device shown in FIG. 1.

FIG. 2 illustrates a simplified cross-section of the integrated voltage regulator 100 in the region of an electronic device 110b shown in FIG. 1, according to an embodiment of the disclosure. As shown in FIG. 2, electronic device 110b is thermally coupled to thermal inlay 114b. As described above, the interface between the electronic device and the thermal inlay 114b may be filled with a thermal interface material, a solder or other suitable high thermal conductivity material. The thermal inlay 114b is thermally coupled to substrate 118 with a thermal interface material 116b, solder or other suitable high thermal conductivity material. Substrate 118 can be a ceramic-based multilayer routing structure that includes metallic conductors, such as, but not limited to copper or aluminum. Substrate 118 can be thermally coupled to cold plate 122 with a thermal interface material 120, solder or other suitable high thermal conductivity material.

As shown in FIG. 2, thermal energy dissipated by electronic device 110b can be efficiently conducted through the first solder or thermal interface material to the thermal inlay 114b. A temperature of electronic device 110b can be represented by Tj (e.g., junction temperature of the solid-state semiconductor device). A temperature at the outside of electronic device 110b can be represented by Tc (e.g., case temperature). Thermal energy from the semiconductor device is coupled through the thermal inlay 114 which can spread out the thermal energy to reduce the power density. A temperature at the bottom of thermal inlay 114 can be represented by Tpcb (e.g., a temperature of the circuit board).

The thermal energy can then be conducted through thermal interface material 116b to substrate 118. The power density of the thermal energy can be further reduced within substrate 118 and conducted through thermal interface material 120 to the cold plate 122. A temperature at the exterior of the cold plate 122 can be represented by Th (e.g., housing temperature) and a temperature of the coolant within the cold plate can be represented by Ta (e.g., ambient temperature). This efficient thermal path provides a reduced temperature change between the cold plate and the junction of the semiconductor device, allowing the semiconductor device to operate at a lower temperature than conventional structures.

Figure 3B:
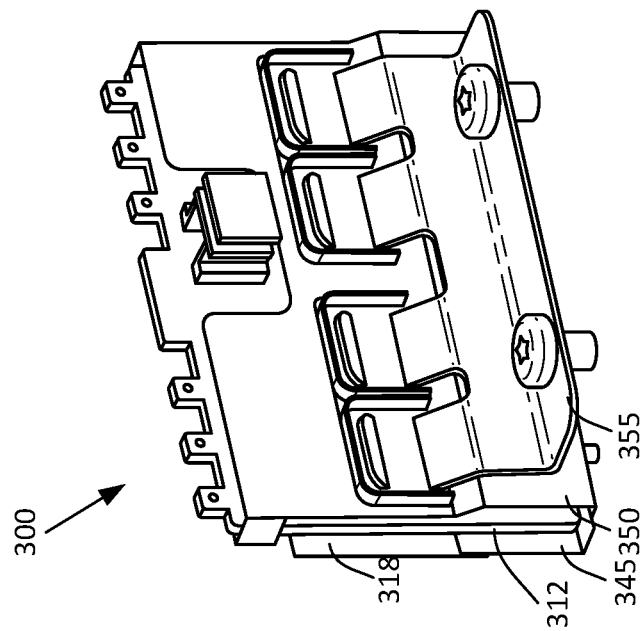
FIG. 3B illustrates a simplified assembled isometric drawing of the integrated voltage regulator shown in FIG. 3A.
Figure 3A:
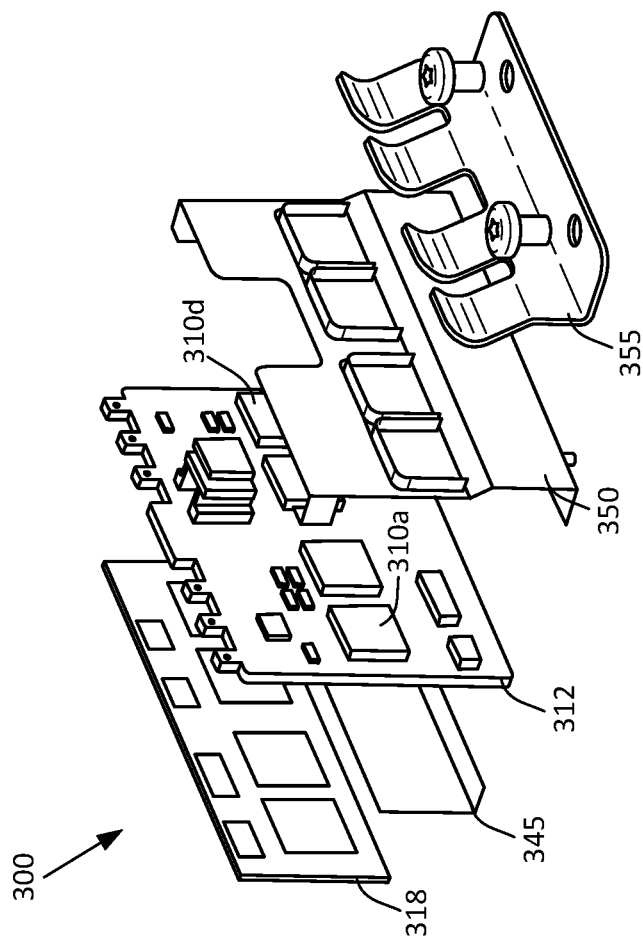
FIG. 3A illustrates a simplified exploded isometric drawing of an example integrated voltage regulator, according to an embodiment of the disclosure.

FIG. 3A illustrates a simplified exploded isometric drawing of an example integrated voltage regulator 300, according to an embodiment of the disclosure. FIG. 3B illustrates a simplified assembled isometric drawing of the integrated voltage regulator shown in FIG. 3A. Voltage regulator 300 may be similar to voltage regulator 100, however voltage regulator 300 includes insulative cover and a spring-loaded clip, as described in more detail herein.

As shown in FIG. 3A, four electronic devices 310a-310d are attached to a circuit board 312. Circuit board 312 includes thermal inlays (not shown) positioned under each respective electronic device 310a-310d. In some embodiments the thermal inlays extend through an entire thickness of circuit board 312 and efficiently conduct thermal energy out of each respective electronic device 310a-310d.

In some embodiments each electronic device 310a-310d is soldered to the respective thermal inlay with a suitable solder alloy (e.g., lead-free tin/silver/copper alloy, sintered silver, etc.), however in other embodiments a thermal interface material may be used. Circuit board 312 is thermally coupled to a substrate 318 with a thermal interface material (not shown), which in some cases may be solder. In some embodiments substrate 318 can be a multilayer thermally conductive routing structure such as direct bonded copper (DBC) or other suitable structure. A plastic insulator 345 may be positioned between a portion of circuit board 312 and substrate 318.

An insulative cover 350 may be positioned across a top surface of circuit board 312. A spring-loaded clip 355 may be positioned to apply compressive pressure between insulative cover 350 and the cold plate (not shown). More specifically, in some embodiments when a thermal interface material is used between substrate 318 and the cold plate, and/or between the substrate and circuit board 312, compressive pressure is applied to the thermal interface material(s) via the spring-loaded clip.

In some embodiments electronic devices 110a-110d may be electrically configured to operate as a full-bridge inverter circuit, while in other embodiments they may operate as an AC to DC converter, a DC to DC converter or and AC to AC converter.

In the foregoing specification, embodiments of the disclosure have been described with reference to numerous specific details that can vary from implementation to implementation. The specification and drawings are, accordingly, to be regarded in an illustrative rather than a restrictive sense. The sole and exclusive indicator of the scope of the disclosure, and what is intended by the applicants to be the scope of the disclosure, is the literal and equivalent scope of the set of claims that issue from this application, in the specific form in which such claims issue, including any subsequent correction. The specific details of particular embodiments can be combined in any suitable manner without departing from the spirit and scope of embodiments of the disclosure.

Additionally, spatially relative terms, such as "bottom" or "top" and the like can be used to describe an element and/or feature's relationship to another element(s) and/or feature(s) as, for example, illustrated in the figures. It will be understood that the spatially relative terms are intended to encompass different orientations of the device in use and/or operation in addition to the orientation depicted in the figures. For example, if the device in the figures is turned over, elements described as a "bottom" surface can then be oriented "above" other elements or features. The device can be otherwise oriented (e.g., rotated 90 degrees or at other orientations) and the spatially relative descriptors used herein interpreted accordingly.

Terms "and," "or," and "and/or," as used herein, may include a variety of meanings that also is expected to depend at least in part upon the context in which such terms are used. Typically, "or" if used to associate a list, such as A, B, or C, is intended to mean A, B, and C, here used in the inclusive sense, as well as A, B, or C, here used in the exclusive sense. In addition, the term "one or more" as used herein may be used to describe any feature, structure, or characteristic in the singular or may be used to describe some combination of features, structures, or characteristics. However, it should be noted that this is merely an illustrative example and claimed subject matter is not limited to this example. Furthermore, the term "at least one of" if used to associate a list, such as A, B, or C, can be interpreted to mean any combination of A, B, and/or C, such as A, B, C, AB, AC, BC, AA, AAB, ABC, AABBCCC, etc.

Reference throughout this specification to "one example," "an example," "certain examples," or "exemplary implementation" means that a particular feature, structure, or characteristic described in connection with the feature and/or example may be included in at least one feature and/or example of claimed subject matter. Thus, the appearances of the phrase "in one example," "an example," "in certain examples," "in certain implementations," or other like phrases in various places throughout this specification are not necessarily all referring to the same feature, example, and/or limitation. Furthermore, the particular features, structures, or characteristics may be combined in one or more examples and/or features.

In the preceding detailed description, numerous specific details have been set forth to provide a thorough understanding of claimed subject matter. However, it will be understood by those skilled in the art that claimed subject matter may be practiced without these specific details. In other instances, methods and apparatuses that would be known by one of ordinary skill have not been described in detail so as not to obscure claimed subject matter. Therefore, it is intended that claimed subject matter not be limited to the particular examples disclosed, but that such claimed subject matter may also include all aspects falling within the scope of appended claims, and equivalents thereof.

What is claimed is:

1. An integrated voltage regulator comprising:
   a plurality of electronic devices;
   a circuit board including a plurality of thermally conductive inlays, the circuit board including a first surface opposite a second surface, wherein each of the plurality of thermally conductive inlays extend from the first surface to the second surface, wherein at least one of the plurality of electronic devices is thermally coupled to at least one of the plurality of thermally conductive inlays at the first surface; and
   a substrate thermally coupled to the second surface of the circuit board and to the plurality of thermally conductive inlays.

2. The integrated voltage regulator of claim 1, wherein each of the plurality of thermally conductive inlays comprise copper.

3. The integrated voltage regulator of claim 1, wherein each of the plurality of electronic devices is soldered to a respective one of the plurality of thermally conductive inlays.

4. The integrated voltage regulator of claim 3, further comprising a thermal interface material positioned between the circuit board and the substrate.

5. The integrated voltage regulator of claim 4, further comprising a spring-loaded clip configured to hold the thermal interface material under compression.

6. The integrated voltage regulator of claim 5, further comprising an insulative cover positioned between the spring-loaded clip and the plurality of electronic devices.

7. The integrated voltage regulator of claim 1, wherein each of the plurality of electronic devices include one or more gallium nitride-based semiconductor devices.

8. The integrated voltage regulator of claim 1, wherein the substrate is a direct-bonded copper laminate.

9. An electronic assembly comprising:
a circuit board including a thermally conductive inlay that extends through a thickness of the circuit board,
a semiconductor device positioned within an electronic package that is attached to a top surface of the circuit board and thermally coupled to the thermally conductive inlay;
a thermal interface material positioned across at least a portion of a bottom surface of the circuit board; and
a substrate thermally coupled to the circuit board and to the thermally conductive inlay via the thermal interface material.

10. The electronic assembly of claim 9, wherein the thermally conductive inlay comprises copper.

11. The electronic assembly of claim 9, wherein the thermally conductive inlay is press-fit within the circuit board.

12. The electronic assembly of claim 11, wherein the electronic package is soldered to the thermally conductive inlay.

13. The electronic assembly of claim 9, further comprising a spring-loaded clip configured to hold the thermal interface material under compression.

14. The electronic assembly of claim 13, further comprising an insulative cover positioned between the spring-loaded clip and the electronic package.

15. The electronic assembly of claim 9, wherein the semiconductor device is a gallium nitride-based device.

16. The electronic assembly of claim 9, wherein the substrate is a direct-bonded copper laminate.

17. A method of forming an electronic assembly comprising:
forming a circuit board;
forming an aperture in the circuit board;
positioning a thermal inlay within the aperture and securing the inlay within the aperture, wherein the thermal inlay extends through a thickness of the circuit board;
attaching an electronic package to a top surface of the circuit board and thermally coupling the electronic package to the thermal inlay;
attaching a thermal interface material to a bottom surface of the circuit board; and
attaching a substrate to the thermal interface material and thermally coupling the substrate to the circuit board and to the thermal inlay.

18. The method of claim 17, wherein the electronic package includes a gallium nitride-based semiconductor device.

\* \* \* \* \*